United States Patent
Vig et al.

(10) Patent No.: US 6,692,676 B1
(45) Date of Patent: Feb. 17, 2004

(54) METHOD FOR FABRICATING A MAGNET STRUCTURE

(75) Inventors: Ravi Vig, Bow, NH (US); Daniel S. Dwyer, Manchester, NH (US); Gregory R. Bowman, Waltham, MA (US); Sandra R. Pinelle, Nashua, NH (US); Terry R. Clapp, Goffstown, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 158 days.

(21) Appl. No.: 09/837,991

(22) Filed: Apr. 19, 2001

Related U.S. Application Data

(62) Division of application No. 09/264,254, filed on Mar. 8, 1999, now Pat. No. 6,278,269.

(51) Int. Cl.[7] .......................... B29C 45/14; B29C 45/16
(52) U.S. Cl. .............. 264/255; 264/271.1; 264/272.15; 264/272.19
(58) Field of Search .................. 264/250, 254, 264/255, 259, 271.1, 275, 104, 105, 272.19, 272.2, 272.15, 427, 429; 29/607, 608

(56) References Cited

U.S. PATENT DOCUMENTS

| | | | | |
|---|---|---|---|---|
| 3,607,528 A | * | 9/1971 | Gassaway | 156/230 |
| 3,728,786 A | * | 4/1973 | Lucas et al. | 29/598 |
| 4,573,258 A | * | 3/1986 | Io et al. | 29/596 |
| 4,670,715 A | | 6/1987 | Fuzzell | 324/208 |
| 4,719,419 A | | 1/1988 | Dawley | 324/208 |
| 4,745,363 A | | 5/1988 | Carr et al. | 324/208 |
| 4,789,826 A | | 12/1988 | Willett | 324/208 |
| 4,796,354 A | * | 1/1989 | Yokoyama et al. | 29/608 |
| 4,910,861 A | * | 3/1990 | Dohogne | 29/598 |
| 4,983,916 A | | 1/1991 | Iijima | 324/207.21 |
| 5,078,944 A | * | 1/1992 | Yoshino | 264/254 |
| 5,137,677 A | * | 8/1992 | Murata | 264/272.16 |
| 5,167,896 A | * | 12/1992 | Hirota et al. | 264/255 |
| 5,185,919 A | * | 2/1993 | Hickey | 29/602.1 |
| 5,332,965 A | | 7/1994 | Wolf et al. | 324/207.12 |
| 5,479,695 A | | 1/1996 | Grader et al. | 29/602.1 |
| 5,497,081 A | | 3/1996 | Wolf et al. | 324/207.12 |
| 5,500,994 A | * | 3/1996 | Itaya | 29/598 |
| 5,551,146 A | * | 9/1996 | Kawabata et al. | 29/608 |
| 5,581,179 A | | 12/1996 | Engel et al. | 324/207.2 |
| 5,691,637 A | | 11/1997 | Oswald | 324/207.23 |
| 5,714,102 A | * | 2/1998 | Highum et al. | 264/105 |
| 5,729,128 A | | 3/1998 | Bunyer et al. | 324/202 |
| 5,757,181 A | | 5/1998 | Wolf et al. | 324/270.12 |
| 5,781,005 A | | 7/1998 | Vig et al. | 324/207.2 |
| 5,789,658 A | | 8/1998 | Henn et al. | 73/1.37 |
| 5,789,915 A | | 8/1998 | Ingraham | 324/207.2 |
| 5,818,223 A | | 10/1998 | Wolf | 324/270.12 |
| 5,839,185 A | * | 11/1998 | Smith et al. | 29/609 |
| 5,841,276 A | | 11/1998 | Makino et al. | 324/207.21 |
| 5,963,028 A | | 10/1999 | Engel et al. | 324/207.2 |
| 6,136,250 A | * | 10/2000 | Brown | 264/272.2 |
| 6,180,041 B1 | * | 1/2001 | Takizawa | 264/255 |
| 6,198,373 B1 | * | 3/2001 | Ogawa et al. | 336/83 |

* cited by examiner

Primary Examiner—Angela Ortiz
(74) Attorney, Agent, or Firm—Daly, Crowley & Mofford, LLP

(57) ABSTRACT

A magnet structure including a magnet and an integral magnetically permeable concentrator and methods for making the same are provided. The concentrator is comprised of a plastic loaded with one or more magnetically permeable materials to a percentage suitable for providing desired magnetic field characteristics. The magnetic element may be comprised of a conventional magnetic material or a plastic loaded with one or more magnetic materials. An insert molding technique is described in which either the concentrator or magnetic element is prefabricated and inserted into a mold which is subsequently filled with a loaded plastic to provide the other component of the magnet structure. In an alternate fabrication technique, both the concentrator and magnet are sequentially formed by injection molding in the same mold. Also described is a magnet structure including a ring magnet having a central aperture in which a steel rod is disposed.

21 Claims, 10 Drawing Sheets

METHOD FOR FABRICATING A MAGNET STRUCTURE

CROSS-REFERENCE TO RELATED APPLICATIONS

This application is a divisional of U.S. patent application Ser. No. 09/264,254, filed Mar. 8, 1999 now U.S. Pat. No. 6,278,269.

STATEMENTS REGARDING FEDERALLY SPONSORED RESEARCH

Not applicable.

BACKGROUND OF THE INVENTION

Various applications require the use of magnets designed to create a particular magnetic field, both in terms of the field pattern and strength. One such application is a proximity sensor for detecting a passing ferromagnetic article, such as a gear tooth. Conventional proximity sensors include a magnet and an integrated circuit having a Hall device. The integrated circuit is positioned in the magnetic field created by the magnet. In use, the Hall device generates an electrical signal related to the strength of the magnetic field normal to the plane of the Hall device. Thus, as a ferromagnetic article moves relative to the Hall device and the strength of the magnetic field changes, the electrical signal generated by the Hall device changes.

One way of tailoring the pattern and strength of the magnetic field provided by a magnet structure in order to provide suitable peak and open circuit characteristics is to use a magnetically permeable concentrator. The concentrator is positioned in close proximity to the magnet and effectively concentrates the magnetic field as a function of its material, geometry, and spatial relationship to the magnet.

In one such magnet structure, a magnetically concentrating steel plate is bonded between two semicircular pieces of sintered Samarium Cobalt (SmCo) magnetic material. The resulting structure may then be machined to provide a desired form factor for use in a particular application. For example, some conventional proximity sensor packages require the magnet structure to have a truncated semicircular cross-section.

The above-described magnet structure suffers certain drawbacks. In particular, costly bonding and aligning processes are required to assemble the magnet and concentrator and, even then, tight position tolerances may be difficult to meet. Further, over time, the concentrator may move relative to the magnet, thereby adversely impacting the device performance. Additionally, there is no easy way to "fine tune" the resulting magnetic field without experimenting with various concentrator materials, geometries, and placement relative to the magnet.

SUMMARY OF THE INVENTION

The invention relates to a magnet structure including a magnetic element and an integral magnetically permeable concentrator and methods for making the same. The integral formation of the concentrator and the magnetic element results in a unitary magnet structure in which the concentrator and magnetic element cannot be separated without destroying the structure. The concentrator and magnetic element are held together either by an interference fit and/or by a chemical bond. At least one of the components is formed by a molding process, with the other component placed in (and in one embodiment previously formed in) the mold.

In one embodiment, the concentrator has a substantially planar base with a post extending normal to the base and the magnetic element is provided in the form of a ring magnet having an outer diameter and an inner diameter defining a central aperture. The concentrator and ring magnet are formed such that the concentrator post extends into the central aperture of the ring magnet and at least a portion of the concentrator base is disposed adjacent to a surface of the ring magnet.

The concentrator is comprised of a plastic loaded with one or more magnetically permeable materials. Suitable plastics include thermoplastics, such as polyamide, polyphenylene sulfide (PPS), and polyphthalamide (PPA), and thermosets, such as epoxy molding compounds. Suitable magnetically permeable materials include iron, stainless steel, ferrite, and iron oxide. The plastic is loaded with the magnetically permeable material to a predetermined percentage by weight as the function of the desired magnetic field pattern and strength characteristics. As one example, the concentrator is comprised of polyamide loaded with iron particles to approximately five percent by weight.

The magnetic element may be comprised of a conventional magnetic material, such as sintered Samarium Cobalt (SmCo). Alternatively, the magnetic element may be comprised of a plastic loaded with one or more magnetic materials. Suitable plastics are as noted above for the concentrator and suitable magnetic materials include magnetic ferrite and SmCo.

Insert molding techniques are described for providing the integral concentrator and magnetic element. In accordance with one such technique, one of the components of the magnet structure (i.e., either the magnetic element or the concentrator) is prefabricated and placed in a cavity of a mold and a plastic compound is injected into the mold to contact at least a portion of the prefabricated component. The plastic compound is loaded with either magnetically permeable material or magnetic material, depending on which component is being formed. For example, in one embodiment, a sintered SmCo ring magnet is placed into a cavity of a mold and a magnetically permeable plastic compound is injected into the mold so as to contact one surface of the ring magnet and extend into the central aperture of the ring magnet, thereby forming the concentrator.

In accordance with an alternate insert molding technique suitable for fabricating a device in which the magnet is formed from a magnetically loaded plastic, a first plastic compound is injected into a mold cavity to form one of the components of the device (i.e., either a magnetic plastic compound is injected to form the magnet or a magnetically permeable plastic compound is injected to form the concentrator). Thereafter, the mold parts are moved relative to one another so as to form a further mold cavity and a second plastic compound is injected into this mold cavity to contact at least a portion of the previously formed component and form the other component of the structure.

Also described is a magnet structure including a ring magnet and a steel rod concentrator positioned in the central aperture of the ring magnet. In one embodiment, the steel rod is pre-cut to a length substantially equal to the height of the magnet and is held in place in the aperture of the ring magnet by a mechanical bonding process, such as with the use of an adhesive.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
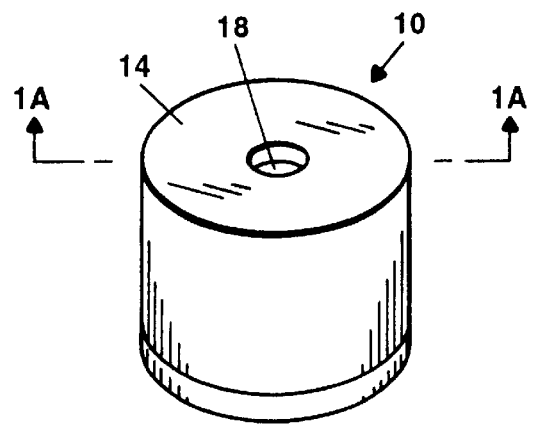
FIG. 1 is an isometric view of a magnet structure including a ring magnet and an integral concentrator according to the invention.

Referring to FIG. 1, a magnet structure 10 includes a magnetic element 14 and an integral magnetically permeable concentrator 18. The concentrator 18 is integral with the magnetic element 14 in the sense that these components are held together either by an interference fit and/or by a chemical bond. This arrangement is achieved by integral formation of the concentrator and magnet and is in contrast to some conventional magnet/concentrator structures in which the magnet and concentrator are separately fabricated components which are assembled together by a mechanical bonding process and machined to yield a desired form factor. The illustrative magnetic element 14 is ring-shaped and may be referred to as a ring magnet. However, it will be appreciated by those of ordinary skill in the art that magnet structures according to the present invention may utilize magnetic elements and concentrators of other geometries and still gain the benefits of the present invention.

The magnet structure 10 is suitable for various applications, such as a proximity sensor, as described in conjunction with FIG. 9 below. In general, the magnet structure is well suited for use in any application in which it is desired to provide a relatively inexpensive magnet structure which can be easily adapted to provide a desired magnetic field pattern and strength.

The concentrator 18 is comprised of a magnetically permeable material which, due to the fabrication techniques described herein, can be readily tailored to provide the magnet structure with a predetermined, desired magnetic field pattern and strength. In particular, the concentrator 18 is comprised of a compound of a plastic material loaded with particles of one or more magnetically permeable materials. Suitable plastics include: thermoplastics, such as polyamide, polyphenylene sulfide (PPS), and polyphthalamide (PPA), and thermosets, such as epoxy molding compounds. Suitable magnetically permeable materials include: iron, stainless steel, ferrite, and iron oxide.

The relative percentages of the plastic and the magnetically permeable material can be varied to suit a particular application. As one example, the concentrator 18 is comprised of polyamide loaded with iron particles to approximately five percent by weight. As another example, the concentrator 18 is comprised of polyamide loaded with ferrite particles to approximately ten percent by weight.

The magnetic element 14 is comprised of one or more magnetic materials, such as sintered Samarium Cobalt (SmCo), or a combination of a plastic and one or more magnetic materials selected to provide predetermined, desired magnetic field characteristics. Suitable plastics include thermoplastics, such as polyamide, polyphenylene sulfide (PPS), and polyphthalamide (PPA), and thermosets, such as epoxy molding compounds. Suitable magnetic materials include magnetic ferrite and SmCo. Generally, such a magnet is formed by loading the plastic with magnet particles to a percentage on the order of approximately 60%–70% by weight, such as 63% by weight.

Various techniques are suitable for integrally forming the concentrator 18 and magnetic element 14. In the illustrative embodiment, the magnet structure 10 is formed by an insert molding process, as described further below in conjunction with FIGS. 2 and 3.

Figure 1A:
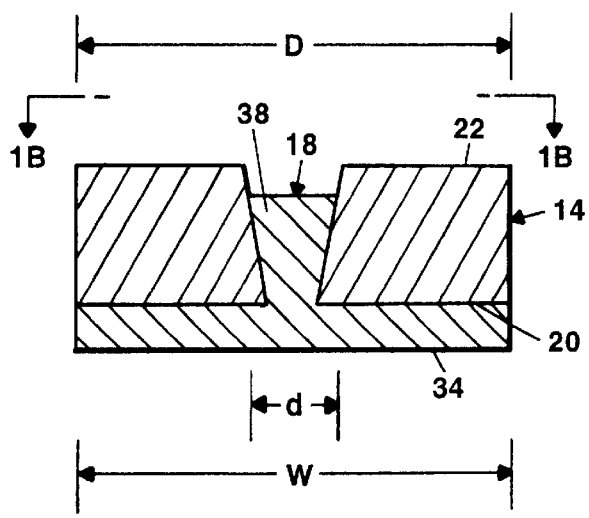
FIG. 1A is a cross-sectional view of the magnet structure of FIG. 1 taken along line 1A—1A of FIG. 1.
Figure 1B:
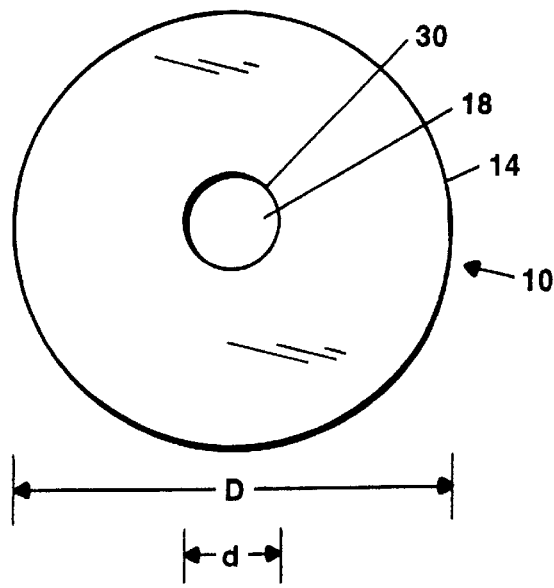
FIG. 1B is a top view of the magnet structure of FIG. 1.

Referring also to FIGS. 1A and 1B, cross-sectional and top views respectively of the magnet structure 10 including the concentrator 18 and magnet 14 are shown. The ring magnet 14 has a first surface 20, a second, opposing surface 22, an outer diameter "D", and an inner diameter "d" defining a central aperture 30. The concentrator 18 has a substantially planar base 34 with a diameter "W" and a substantially cylindrical post 38 extending substantially normal to the base. A portion of the first surface 20 of the ring magnet 14 is adjacent to a portion of the concentrator base 34, as shown in FIG. 1A.

The ring magnet 14 and integral concentrator 18 are held together by an interference fit and/or a chemical bond. An interference fit between the two components can be achieved in various ways. As one example, the inner diameter "d" of the ring magnet 14 is tapered, as shown in FIG. 1A, such that the ring magnet is prevented from slipping off of the concentrator post. Another technique for achieving an interference fit is to provide a lip on the concentrator which extends into the magnet to interfere with the magnet, as shown in the embodiment of FIGS. 5–5B. In applications in which the magnet 14 is comprised of a magnetically loaded plastic, the two components (i.e., the magnet and concentrator) may be melted together at an interface to achieve a chemical bond.

In the embodiment of FIGS. 1–1B, the outer diameter "D" of the ring magnet 14 is substantially equal to the outer diameter "W" of the concentrator 18. Note however, that other relationships between the outer diameters "W" and "D" are possible, such as is shown in the embodiment of FIGS. 5–5B, and may even be desirable in order to facilitate manufacture of the device. Further, the concentrator post 38 extends into and terminates within the central aperture 30 of the ring magnet. Here again however, other relationships between the height of the concentrator post and the height of the ring magnet are possible and may be preferable to facilitate certain manufacturing techniques.

Features of the magnet structure 10 can be readily varied without departing from the spirit and scope of the invention, by suitable selection of the mold(s) used to fabricate the structure and the selected materials. For example, the geometries of the components and the placement of the components relative to each other can be varied by appropriate design of the mold. Alternative magnet structures according to the invention are illustrated in FIGS. 4–8A and in FIG. 12. The magnet structure 10 may be varied in order to provide different magnetic field characteristics and/or to comply with packaging, space, or other mechanical constraints associated with a particular application.

Figure 2:
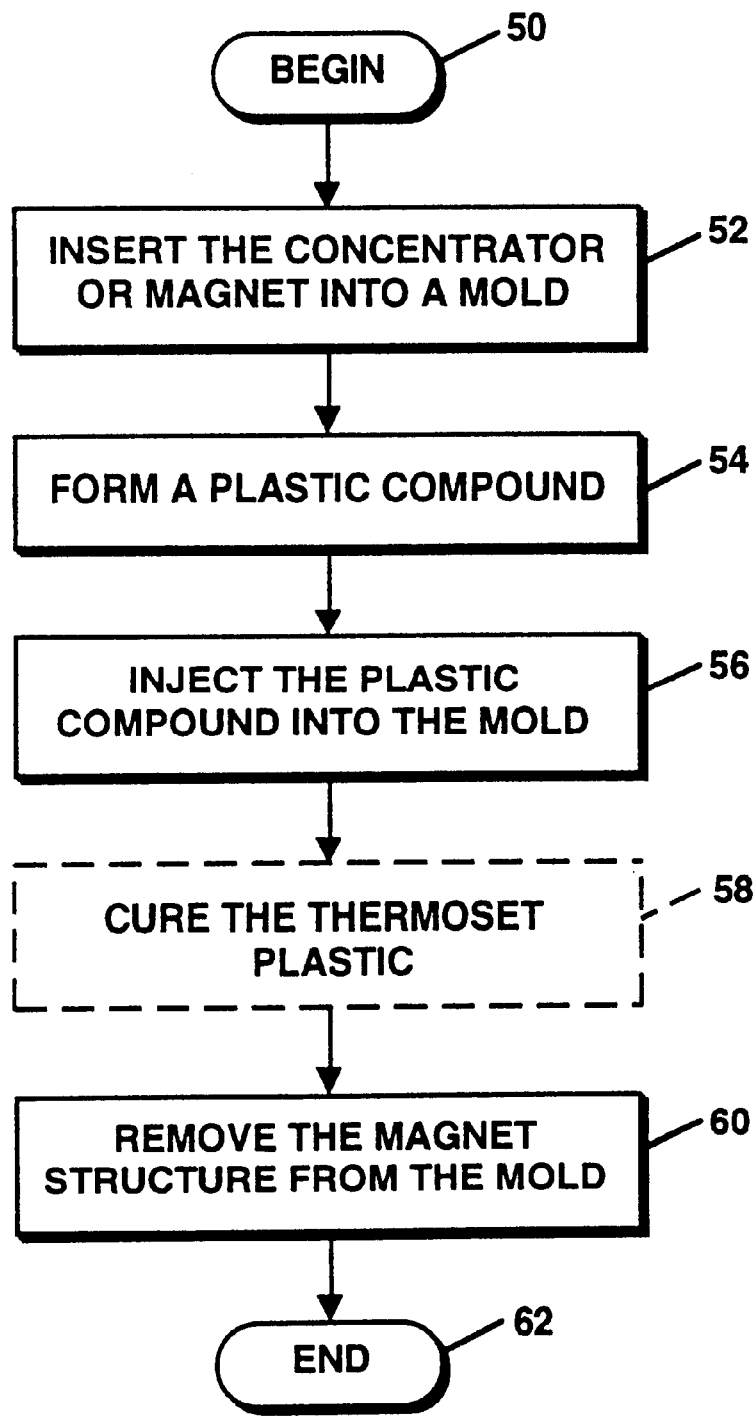
FIG. 2 is a flow diagram illustrating a method for fabricating magnet structures of the present invention.

Referring also to FIG. 2, a flow diagram of an insert molding technique for fabricating the magnet structure 10 commences at step 50. In step 52, one of the components of the magnet structure (i.e., either the magnetic element 14 or the concentrator 18) which has been prefabricated is inserted into a cavity of a mold. As one example, the ring magnet is prefabricated by a conventional sintering technique and is comprised of SmCo.

In step 54, a plastic (i.e., either a thermoplastic or thermoset) is loaded with either magnetically permeable or magnetic particles to provide the plastic compound. More particularly, in applications in which the prefabricated component is the magnet, then the plastic will form the concentrator and is loaded with magnetically permeable particles; whereas, when the prefabricated component is the concentrator, the plastic will form the magnet and thus, is loaded with magnetic particles. In step 56, the plastic compound is injected into the mold cavity and flows into at least partial contact with the prefabricated component, such as the ring magnet. As will be apparent to those of ordinary skill in the art, the extent of contact between the plastic compound and the prefabricated component is a function of the mold shape and the desired magnet structure.

As noted above, the plastic compound may include a thermoplastic or a thermoset plastic. In step 58, the thermoset plastic is cured. This step is optional since, if the plastic compound injected in step 56 includes a thermoplastic, then curing is not necessary. Finally, the resulting magnet structure 10 is removed from the mold in step 60, following which the process terminates in step 62.

With this arrangement, the magnet structure 10 is fabricated by a relatively inexpensive insert molding technique which permits the chemical composition of the molded component to be readily altered in order to facilitate fine tuning of the magnetic field characteristics of the structure, simply by altering the loading of the plastic. Further, use of an insert molding technique eliminates the alignment and tolerance issues which arise in conventional ring magnet/concentrator structures, in which the ring magnet and the concentrator are separately formed parts which are mechanically bonded together and machined to provide a desired form factor.

Figure 3:
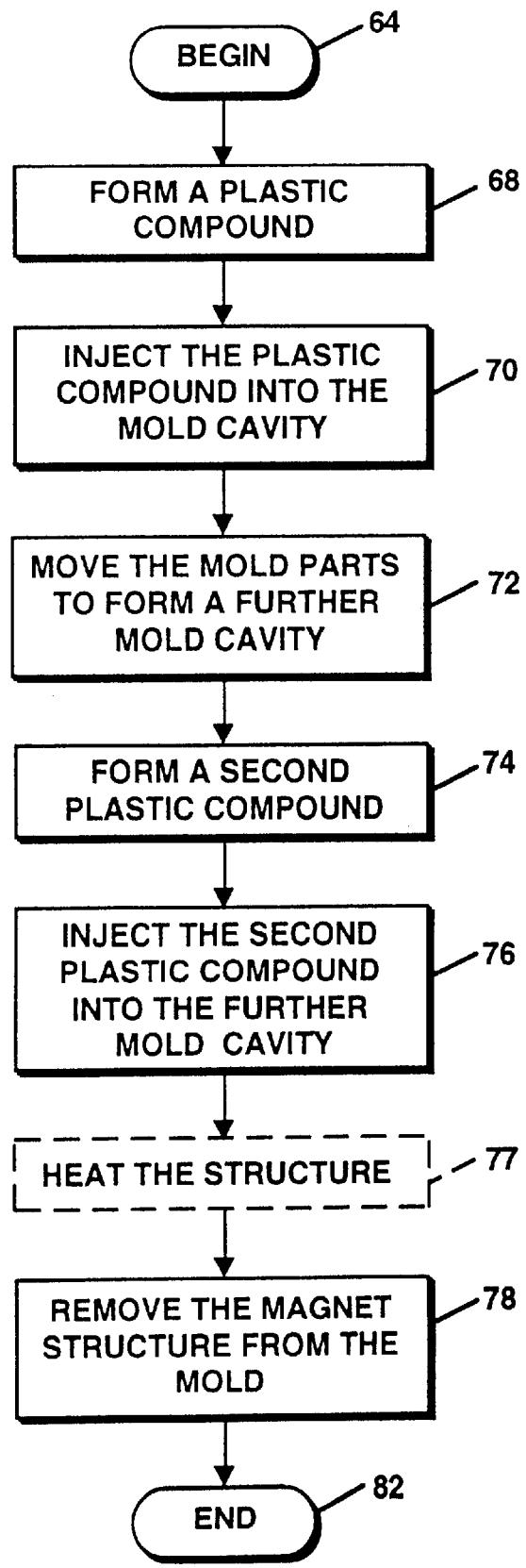
FIG. 3 is a flow diagram illustrating an alternate method of fabricating magnet structures of the invention.

Referring also to FIG. 3, an alternate insert molding technique, which may be referred to as a "double shot" technique, is provided for fabricating magnet structures in which both the concentrator and the magnetic element are comprised of a plastic compound. In general, the technique includes injection of a first plastic compound to form one of the components and subsequent injection of a second plastic compound to form the other component.

The process begins in step 64, after which a plastic compound is formed in step 68. The particular plastic and particles comprising the plastic compound depend on which component the plastic compound will form. For example, if the concentrator is formed first, then the plastic compound includes magnetically permeable particles.

In step 70, the plastic compound is injected into a mold cavity formed by mold parts placed in a first position relative to one another and is allowed to harden. Considering the above example, the magnetically permeable plastic compound is injected and hardens in step 70. In step 72, the mold parts are moved to a second position relative to one another and to the first formed component so as to form a further mold cavity defining the second component to be formed. Note that in the case where the plastic compound includes a thermoset, the plastic is allowed to cure prior to movement of the mold parts.

A second plastic compound is formed in step 74. This plastic compound includes either magnetically permeable or magnetic particles, depending on which component it will form. Still in keeping with the above example in which the concentrator is formed in step 70, the plastic compound formed in step 74 includes magnetic particles. In step 76, the second plastic compound is injected into the further mold cavity. In optional step 77, the structure may be heated to cause slight melting at the interface between the concentrator and magnet element in order to provide a chemical bond between the components. The magnet structure is then removed from the mold in step 78, thereby completing the fabrication of the magnet structure in step 82. Here again, if the plastic compound includes a thermoset, then the structure is allowed to cure prior to its removal from the mold.

It will be appreciated by those of ordinary skill in the art that the plastic compounds may be formed prior to the insert molding process. It will also be appreciated that the particular sequence of steps illustrated in the flow diagrams of FIGS. 2 and 3 can be altered in many instances.

With this arrangement, a single molding system is used to fabricate both the concentrator and magnetic element. This technique advantageously tends to be relatively inexpensive and permits the magnet structure to be provided with relatively intricate geometries.

Figure 4A:
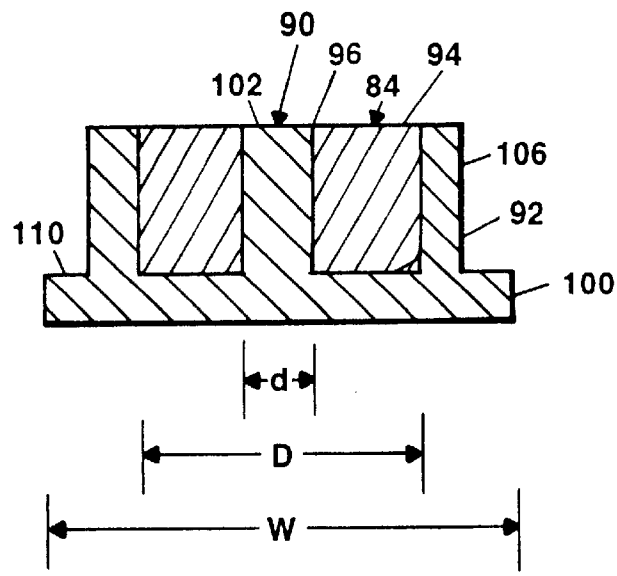
FIG. 4A is a cross-sectional view of the magnet structure of FIG. 4 taken along line 4A—4A of FIG. 4.
Figure 4B:
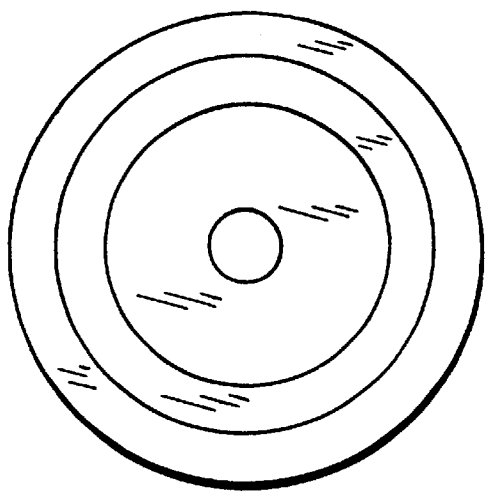
FIG. 4B is a top view of the magnet structure of FIG. 4.
Figure 4:
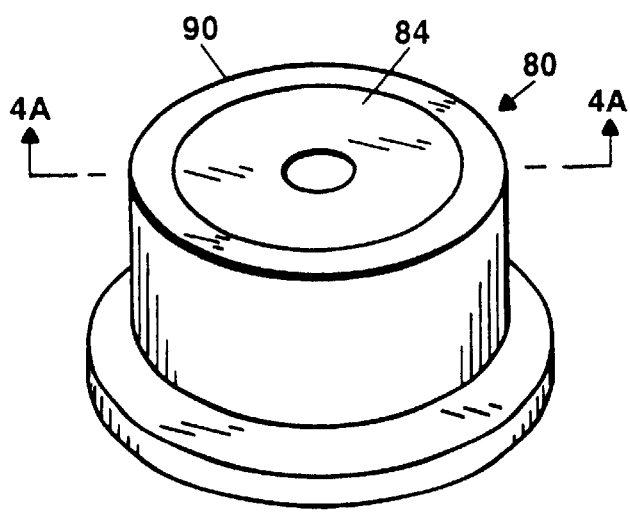
FIG. 4 is an isometric view of an alternative magnet structure according to the invention.

Referring to FIGS. 4, 4A, and 4B, an alternate magnet structure 80 according to the invention includes a magnetic element 84 in the form of a ring magnet 84 and a magnetically permeable concentrator 90. The materials of the concentrator and ring magnet are as described above in conjunction with FIGS. 1–1B. Further, the magnet structure 80 may be provided by the insert molding techniques described above in conjunction with FIGS. 2 and 3. The magnet structure 80 differs from the magnet structure 10 in its geometry and the relative placement of the concentrator 90 and ring magnet 84.

The ring magnet 84 has a first surface 92, a second, opposing surface 94, an outer diameter "D", and an inner diameter "d" defining a central aperture 96. The concentrator 90 has a substantially planar base 100 having a diameter "W", a substantially cylindrical post 102 extending normal to the base, and an annular protrusion 106 also extending normal to the base. The concentrator post 102 and protrusion 106 define an annular depression bordered by the post, the protrusion and a portion of the base 100. The ring magnet 84 and concentrator 90 are integrally formed by one of the above-described techniques such that the ring magnet 84 occupies this annular depression, as shown.

Figure 5A:
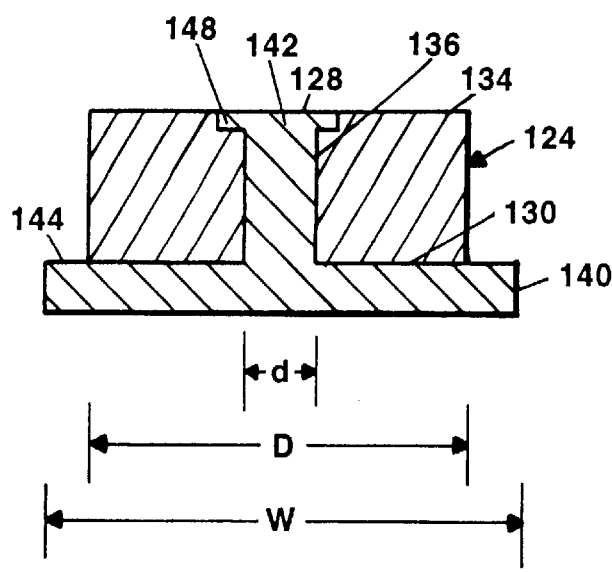
FIG. 5A is a cross-sectional view of the magnet structure of FIG. 5 taken along line 5—5A of FIG. 5.
Figure 5B:
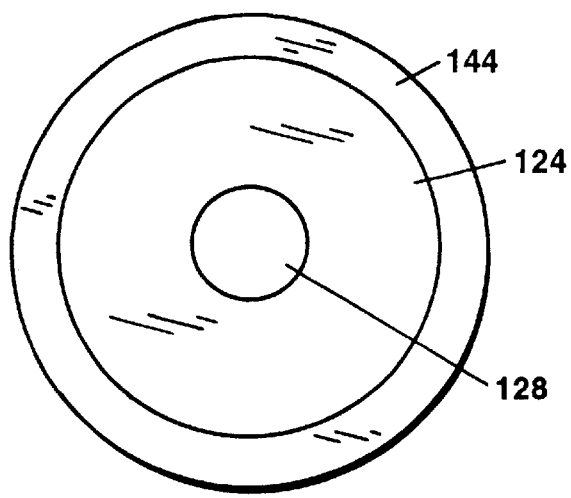
FIG. 5B is a top view of the magnet structure of FIG. 5.
Figure 5:
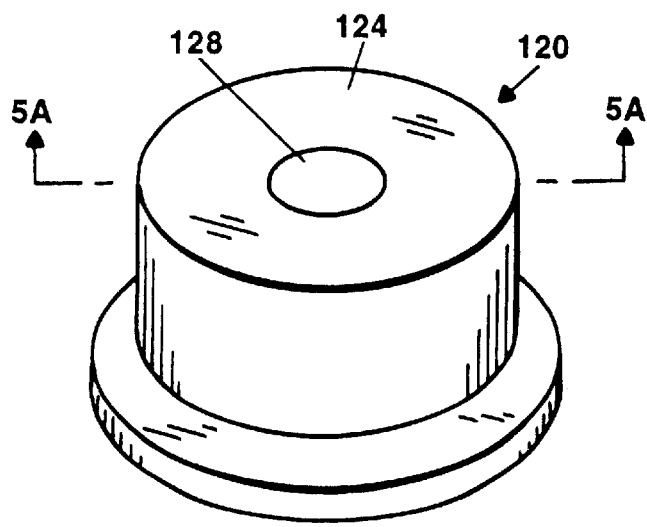
FIG. 5 is an isometric view of a magnet structure according to a further embodiment of the invention.

Referring to FIGS. 5, 5A, and 5B, a further alternate magnet structure 120 according to the invention includes a ring magnet 124 and an integral magnetically permeable concentrator 128. The materials of the concentrator and ring magnet are as described above in conjunction with FIGS. 1–1B and the magnet structure 120 may be provided by the insert molding techniques described above in conjunction with FIGS. 2 and 3.

The ring magnet 124 has a first surface 130, a second, opposing surface 132, an outer diameter "D", and an inner diameter "d" defining a central aperture 136. The concentrator has a lip 148 extending into the magnet, as shown in FIG. 5A. The concentrator 128 has a substantially planar base 140 with a diameter "W" and a substantially cylindrical post 142 extending normal to the base. The ring magnet 124 and concentrator 128 are integrally formed such that the concentrator lip 148 results in a step feature in the magnet which prevents the magnet and concentrator from becoming separated or moving relative to one another. The outer diameter "D" of the ring magnet is smaller than the outer diameter "W" of the concentrator, thereby providing a flange 144 at the outer edge of the concentrator, as may be desirable to facilitate manufacture of the device.

Figure 6A:
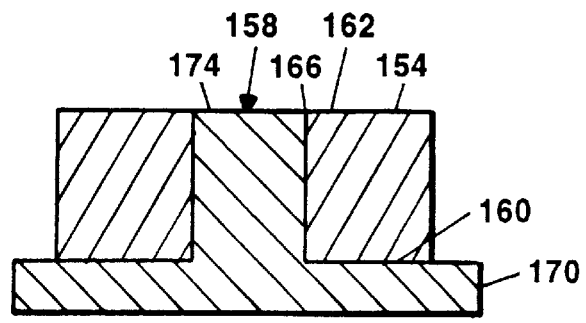
FIG. 6A is a cross-sectional view of the magnet structure of FIG. 6 taken along line 6A—6A of FIG. 6.
Figure 6B:
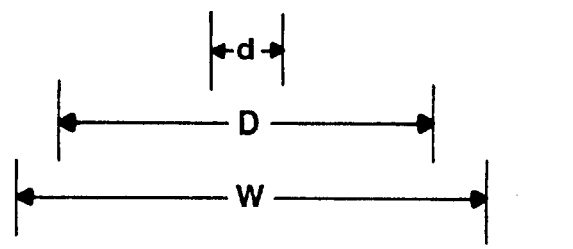
FIG. 6B is a top view of the magnet structure of FIG. 6.
Figure 6:
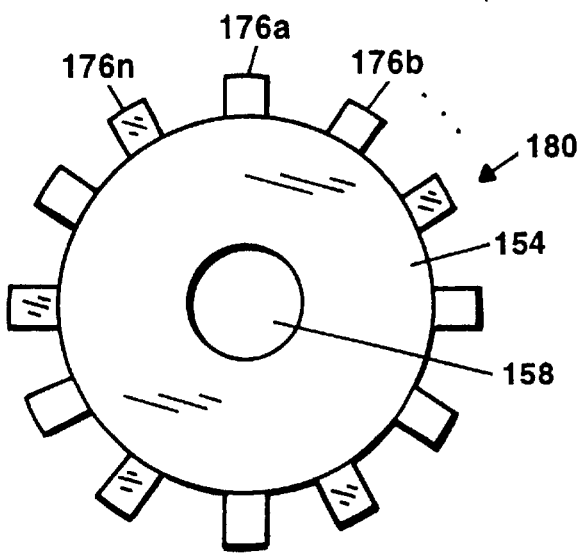
FIG. 6 is an isometric view of another magnet structure according to the invention.

Referring to FIGS. 6, 6A and 6B, a further alternate magnet structure 150 according to the invention includes a ring magnet 154 and an integral magnetically permeable concentrator 158. Here again, the materials of the concentrator 158 and ring magnet 154 are as described above in conjunction with FIGS. 1–1B and the magnet structure 150 may be fabricated by the insert molding techniques described above in conjunction with FIGS. 2 and 3.

The ring magnet 154 has a first surface 160, a second, opposing surface 162, an outer diameter "D", and an inner diameter "d" defining a central aperture 166. The concentrator 158 has a substantially planar base 170 with a diameter "W" and a substantially cylindrical post 174 extending normal to the base, as shown. The concentrator base 170 further has a plurality of tabs 176a–176n, as shown, which may or may not extend to the post 174, as may be desirable to facilitate manufacture of the device.

The ring magnet 154 and concentrator 158 are integrally formed such that the concentrator post 174 extends into the central aperture 166 of the ring magnet and terminates so as to be flush with the surface 162 of the ring magnet, as shown (i.e., the height of the concentrator post 174 is substantially equal to the height of the ring magnet). Further, the outer diameter "D" of the ring magnet 154 is smaller than the outer diameter "W" of the concentrator 158 so that the tabs 176a–176n extend beyond the ring magnet, as shown, and as may be desirable to facilitate manufacture of the device.

Figure 7:
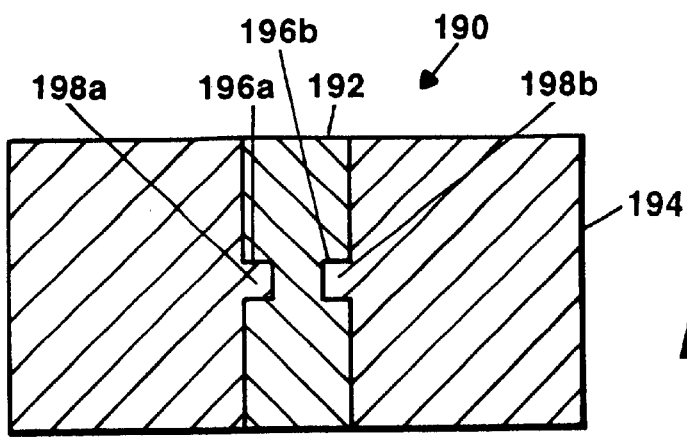
FIG. 7 is a cross-sectional view of a further magnet structure according to the invention.

Referring to FIG. 7, an alternate magnet structure 190 includes a ring-shaped magnet 194 having a pair of protrusions 198a, 198b and a magnetically permeable concentrator 192 having complementary pair of notches, or indentations 196a, 196b. Here again, the materials of the concentrator and ring magnet are as described above in conjunction with FIGS. 1–1B and the magnet structure 190 may be provided by the insert molding techniques described above in conjunction with FIGS. 2 and 3. The concentrator and magnet are held together by interference of the magnet protrusions 198a, 198b and the concentrator notches 196a, 196b. It will be appreciated by those of ordinary skill in the art that although the magnet protrusions 198a, 198b and the concentrator notches 196a, 196b are illustrated to have a squared, step-like shape, alternative complementary shapes, such as a rounded, dome-like shape or a pointed, cone-like shape, are suitable.

Figure 8:
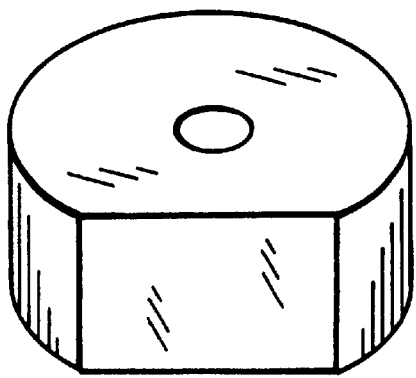
FIG. 8 is an isometric view of still another magnet structure according to the invention.
Figure 8A:
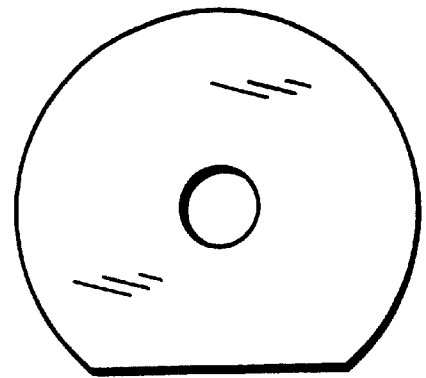
FIG. 8A is a top view of the magnet structure of FIG. 8.

Referring to FIGS. 8 and 8A, a magnet structure 200 according to the invention includes a ring magnet 202 and an integral magnetically permeable concentrator 204. The magnet structure 200 is comprised of the same materials and fabricated in the same manner as described above in conjunction with FIGS. 1–3, but differs in that the magnet structure 200 has an alternative cross-sectional footprint. In particular, the magnet structure 200 has a truncated circular cross-section as is desirable for certain applications.

Figure 9:
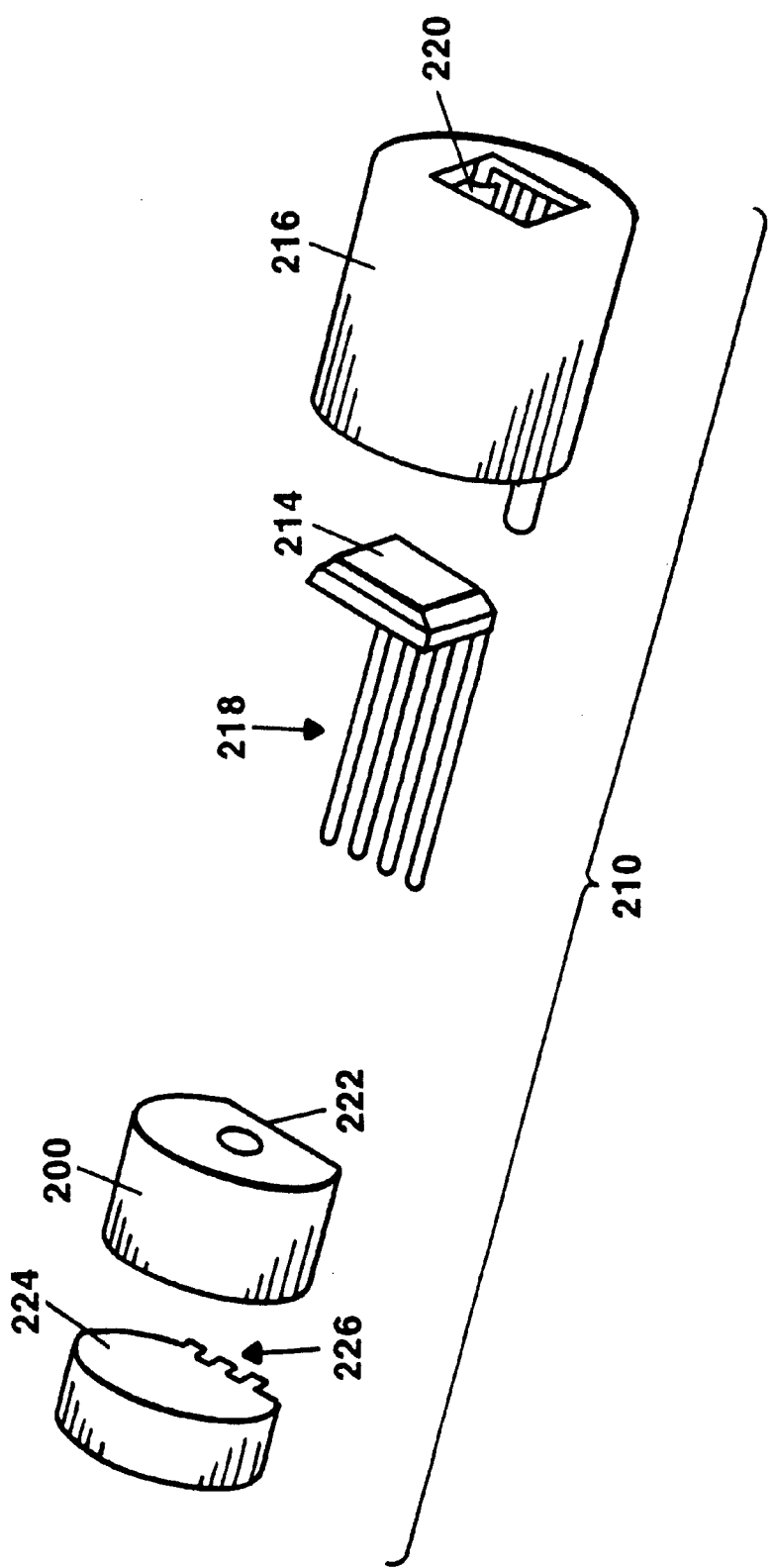
FIG. 9 is an exploded view of a proximity sensor including a magnet structure according to the invention.

Referring also to FIG. 9, a proximity sensor assembly 210 includes the magnet structure 200 of the type shown in FIG. 8 and an integrated circuit 214 containing a Hall device. The assembly 210 further includes a housing 216 having a window 220 and an end cap 224.

In assembly, a portion of the integrated circuit 214 is exposed through the housing window 220 for detection of magnetic field changes caused by movement of a ferromagnetic article past the sensor. More particularly, the magnet structure 200 generates a magnetic field normal to the plane of the Hall device in the chip 214, which magnetic field changes upon the approach of a ferromagnetic article. The truncated surface 222 of the magnet structure 200 is disposed adjacent to conductive leads 218 of the integrated circuit 214 and such leads extend through respective grooves 226 of the end cap 224. Additional details of the assembly 210 are described and shown in U.S. Pat. No. 5,581,179, entitled Hall-effect ferrous-article-proximity sensor assembly, which is incorporated herein by reference in its entirety.

Figure 10:
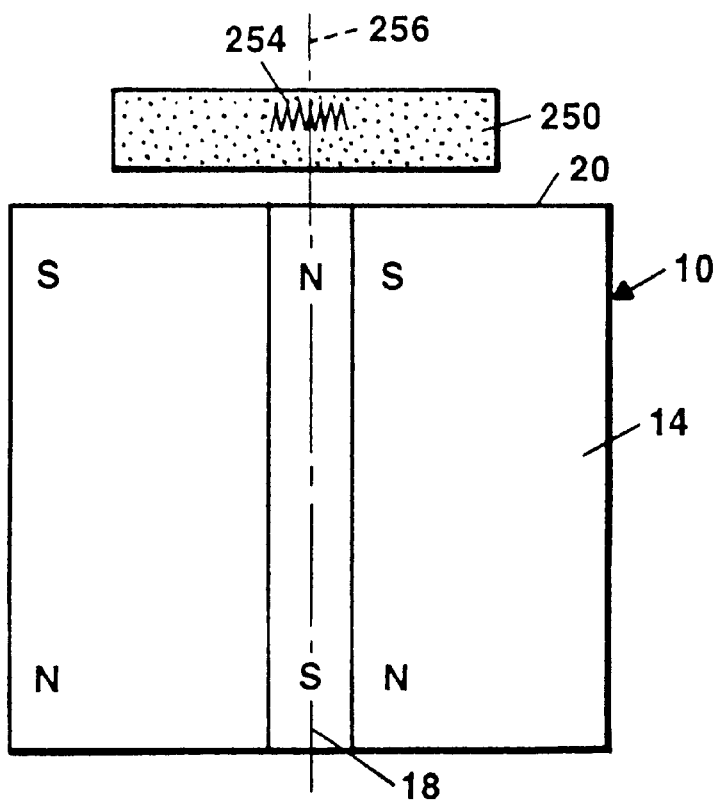
FIG. 10 is a side view of a magnet structure having a front face positioned adjacent to a Hall element according to the invention.

Referring to FIG. 10, the pole configuration of the magnet structures of the present invention, such as magnet structure 10 of FIG. 1, is shown. The surface 20 (referred to as front surface 20) defined by an end of the concentrator 18 and the magnet 14 presents poles of opposite polarity. In particular, in the illustrative embodiment, the concentrator 18 presents a north pole N and the ring magnet 14 presents a south pole S at the front face 20 of the magnet structure 10. It will be appreciated by those of ordinary skill in the art that the magnetic element 14 may or may not be a permanent magnet. Likewise, the concentrator 18 may or may not be a permanent magnet.

Also shown in FIG. 10 is an integrated circuit 250 (like integrated circuit 214 of FIG. 9) which contains a Hall element 254. As is apparent, the integrated circuit 250 is positioned adjacent to the front face 20 of the magnet structure 10, with an axis 256 of the magnet structure normal to the front face 20.

Figure 11:
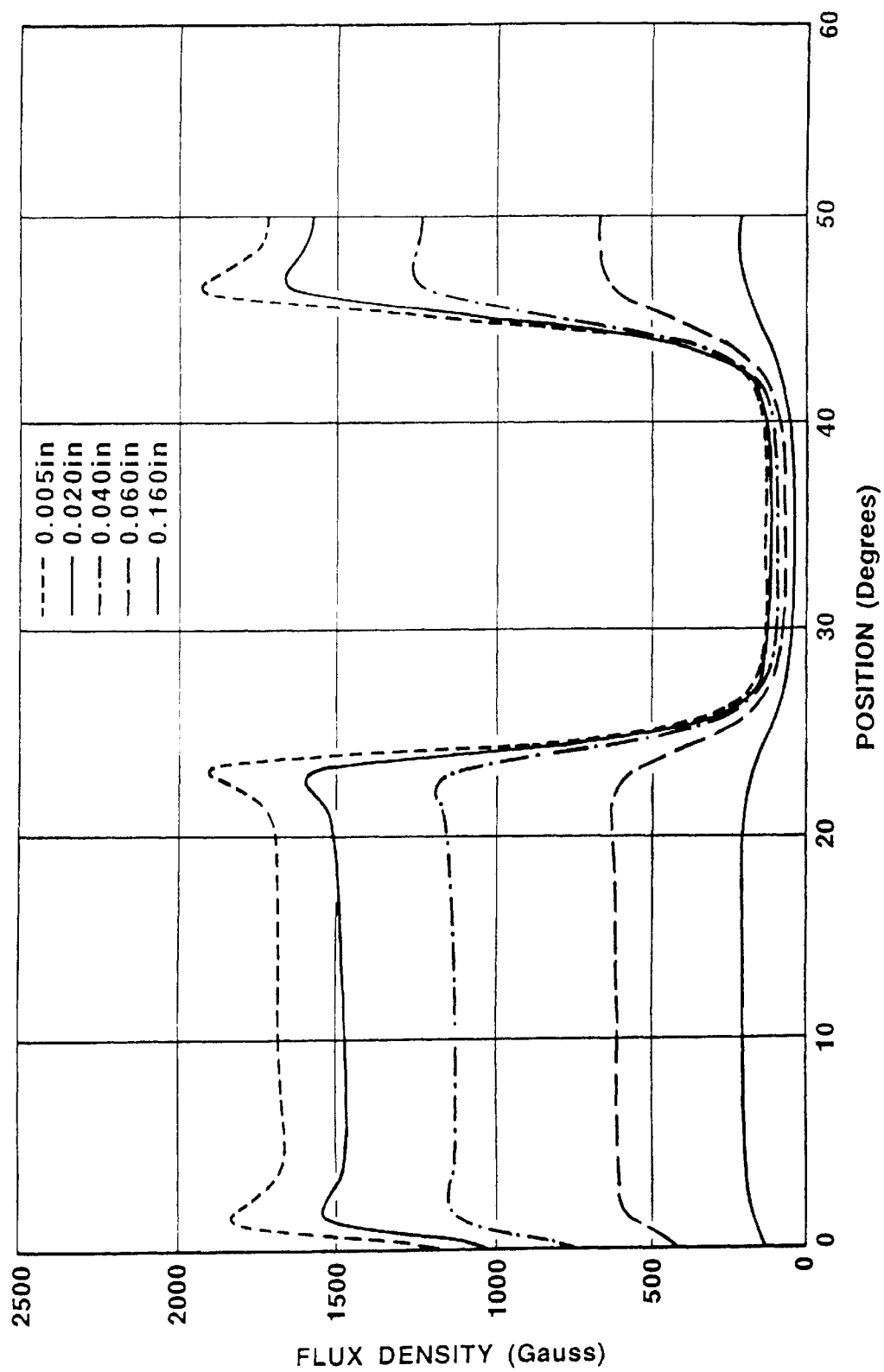
FIG. 11 illustrates the flux density versus ferromagnetic article position relative to a magnet structure of the present invention for various air gaps.

Referring also to FIG. 11, a flux density map (i.e., flux density in Gauss versus proximity of the magnet structure to the Hall effect sensor chip 12) associated with the magnet structures of the present invention, such as the magnet structure 10 of FIG. 1, is shown for various air gaps. The pole configuration provided by the magnet structure 10 lowers the base field (or baseline) of the flux density map by bringing both poles of the magnetic field to front surface 20. More particularly, the position of the opposite poles on the front face 20 serves to short out the lines of flux when the valley between passing magnetic elements, such as gear teeth, is proximate the integrated circuit 250. This creates a low baseline because the magnetic flux lines are parallel to and below the Hall element 254 in the chip 250. A baseline of approximately zero Gauss as measured by the Hall element 254 can be achieved by proper design. When the tooth is present, the Hall element measures a high value. As is apparent, the baseline remains constant and close to zero even as the air gap between the passing ferromagnetic article and the integrated circuit 250 varies. This advantageous result of low baseline substantially independent of air gap is achieved by presenting opposite poles at the front face 20 of the magnet element 10 adjacent to the Hall element 254, as is described in U.S. Pat. No. 5,781,005, entitled "Hall-Effect Ferromagnetic-Article-Proximity Sensor," which patent is assigned to the assignee of the present invention and incorporated herein by reference in its entirety. The magnet structures of the present invention achieve this advantageous result in a cost effective manner by eliminating costly bonding and aligning processes previously required to assemble a magnet and concentrator.

Figure 12:
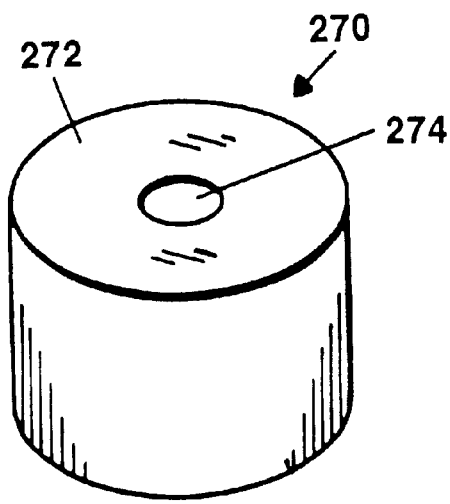
FIG. 12 is an isometric view of another magnet structure according to the invention.

Referring to FIG. 12, an alternative magnet structure 270 according to the invention includes a ring magnet 272 and a cylindrical concentrator 274 disposed in the central aperture of the magnet. The concentrator 274 is provided in the form of a steel rod and the ring magnet 272 may be provided by various techniques from various materials. As one example, the magnet is comprised of sintered SmCo.

Various techniques are suitable for fabricating the magnet structure 270. In the illustrative embodiment, the steel rod 274 is pre-cut to a length substantially equal to the height of the ring magnet 272. In assembly, the rod is positioned in the central aperture of the magnet so that the ends of the steel rod are flush with the substantially flat end surfaces of the ring magnet. A mechanical bond is used to hold the concentrator 274 and the ring magnet 272 together, such as an adhesive, epoxy, or glue.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A method of fabricating a magnet structure, comprising the steps of:
    inserting an element into a cavity of a mold; and
    injecting a selected one of a magnetically permeable plastic compound and a magnetic plastic compound into the mold so as to contact at least a portion of said element, wherein said inserting step and said injecting step result in formation of a concentrator in contact with a magnet, so that an end of each of said concentrator and said magnet define a front face of said magnet structure, said concentrator presenting a magnetic field of one polarity at said front face and said magnet presenting a magnetic field of the opposite polarity at said front face.

2. The method of claim 1 wherein said element inserting step comprises inserting a magnet element into said cavity and said injecting step comprises injecting a magnetically permeable plastic compound into the mold.

3. The method of claim 2 further comprising the step of combining a magnetically permeable material and a plastic to form said magnetically permeable plastic compound.

4. The method of claim 3, wherein said combining step further comprises the step of selecting a percentage weight of said magnetically permeable material in response to a desired magnetic field pattern and desired strength characteristics.

5. The method of claim 4, wherein said plastic is selected from the group consisting of: polyamide, polyphenylene sulfide (PPS), polyphthalamide (PPA), a themoset molding compound, and an epoxy molding compound.

6. The method of claim 4, wherein said magnetically permeable material is selected from the group consisting of: iron, stainless steel, ferrite, and iron oxide.

7. The method of claim 1 wherein said element inserting step comprises inserting a concentrator element into said cavity and said injecting step comprises injecting a magnetic plastic compound into the mold.

8. The method of claim 7, further comprising the step of combining a magnetic material and a plastic to form said magnetic plastic compound.

9. The method of claim 8, wherein said step further comprises the step of selecting a percentage weight of said magnetic material in response to a desired magnetic field pattern and strength characteristics.

10. The method of claim 8, wherein said plastic is selected from the group consisting of: polyamide, polyphenylene sulfide (PPS), polyphthalamide (PPA), and an epoxy molding compound.

11. The method of claim 8, wherein said magnetic material is selected from the group consisting of magnetic ferrite and SmCo.

12. The method of claim 1, further comprising the step of heating the magnet structure to provide a chemical bond between said element and said selected one of the magnetically permeable plastic compound and the magnetic plastic compound.

13. A method of fabricating a magnet structure, comprising the steps of:
    injecting a selected one of a magnetically permeable plastic compound and a magnetic plastic compound into a first mold cavity formed by mold parts placed in a first position relative to one another;
    moving said mold parts to a second position relative to one another to form a second mold cavity; and
    injecting the previously non-selected one of a magnetically permeable plastic compound and a magnetic plastic compound into said second mold cavity, wherein said inserting step and said injecting step result in formation of a concentrator in contact with a magnet, so that an end of each of said concentrator and said magnet define a front face of said magnet structure, said concentrator presenting a magnetic field of one polarity at said front face and said magnet presenting a magnetic field of the opposite polarity at said front face.

14. The method of claim 13, wherein said injecting step further comprises the step of combining a selected percentage weight of magnetically permeable material and a plastic to form said magnetically permeable plastic compound in response to a desired magnetic field pattern and desired strength characteristics.

15. The method of claim 14, wherein said plastic is selected from the group consisting of polyamide, polyphenylene sulfide (PPS), polyphthalamide (PPA), a themoset molding compound, and an epoxy molding compound.

16. The method of claim 14, wherein said injecting step further comprises the step of combining a selected percentage weight of magnetic material and a plastic to form said magnetic plastic compound in response to a desired magnetic field pattern and desired strength characteristics.

17. A method of fabricating a magnet structure, comprising the steps of:

inserting a rod into a central region of a substantially cylindrical mold; and injecting a magnetic plastic compound into said mold so as to form a ring-shaped magnet surrounding and in contact with said rod.

18. The method of claim 17, wherein the rod is comprised of steel.

19. The method of claim 17, said ring-shaped magnet has a height substantially equal to the length of said rod.

20. The method of claim 1, wherein the magnetic field of one polarity and the magnetic field of the opposite polarity cancel to provide an essentially zero magnetic field at said front face.

21. The method of claim 13, wherein the magnetic field of one polarity and the magnetic field of the opposite polarity cancel to provide an essentially zero magnetic field at said front face.

* * * * *

UNITED STATES PATENT AND TRADEMARK OFFICE
CERTIFICATE OF CORRECTION

PATENT NO.    : 6,692,676 B1
DATED         : February 17, 2004
INVENTOR(S)   : Ravi Vig et al.

It is certified that error appears in the above-identified patent and that said Letters Patent is hereby corrected as shown below:

Column 7,
Line 60, delete "having complementary" and replace with -- having a complementary --.

Column 8,
Line 34, delete "entitled Hall-effect ferrous-article-proximity sensor assembly," and replace with -- entitled, "Hall-Effect Ferrous-Article-Proximity Sensor Assembly", --.

Column 11,
Line 8, delete "said ring" and replace with -- wherein said ring --.

Signed and Sealed this

Twenty-second Day of June, 2004

JON W. DUDAS
*Acting Director of the United States Patent and Trademark Office*